(12) United States Patent
Vardhan et al.

(10) Patent No.: US 10,255,394 B1
(45) Date of Patent: Apr. 9, 2019

(54) REDUCED OVERHEAD FOR MASSIVE PARALLEL PROCESSING

(71) Applicant: Cadence Design Systems, Inc., San Jose, CA (US)

(72) Inventors: Harsh Vardhan, Fremont, CA (US); Jalal Wehbeh, Sunnyvale, CA (US); Robert MacDonald, Austin, TX (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 45 days.

(21) Appl. No.: 15/470,732

(22) Filed: Mar. 27, 2017

(51) Int. Cl.
*G06F 17/50* (2006.01)
*G06F 9/50* (2006.01)

(52) U.S. Cl.
CPC ........ *G06F 17/5022* (2013.01); *G06F 9/5066* (2013.01); *G06F 17/5045* (2013.01); *G06F 17/5072* (2013.01); *G06F 17/5081* (2013.01); *G06F 17/5009* (2013.01); *G06F 2217/02* (2013.01)

(58) Field of Classification Search
CPC .................................................. G06F 17/5022
USPC ....................................................... 716/103
See application file for complete search history.

(56) References Cited

U.S. PATENT DOCUMENTS

| 9,043,771 | B1 | 5/2015 | Vardhan et al. |
| 9,135,269 | B2 | 9/2015 | Shetty et al. |
| 9,286,427 | B1* | 3/2016 | Odabasi ............... G06F 17/505 |
| 2009/0013290 | A1* | 1/2009 | Keinert ............... G06F 17/5036 716/136 |
| 2012/0123745 | A1* | 5/2012 | Sheu ................... G06F 17/5036 703/2 |
| 2013/0060657 | A1 | 3/2013 | Kudva et al. |

* cited by examiner

*Primary Examiner* — Suchin Parihar
(74) *Attorney, Agent, or Firm* — McDermott Will & Emery LLP

(57) ABSTRACT

A method for simulating an integrated circuit model is provided. The method includes receiving partition netlists of an integrated circuit in a partition scheduler and scheduling, by at least one computer, an execution of a computational thread associated with a first partition netlist. The method also includes preparing input data for a task and storing the input data set in an object storage. Also, the method includes executing, by the computer, the task in the computational thread. The method also includes building dependency trees between multiple tasks for reducing the input/output data overhead, and caching information that may be necessary for each task but may be reusable by the task when such information is unavailable from previously computed tasks.

20 Claims, 7 Drawing Sheets

REDUCED OVERHEAD FOR MASSIVE PARALLEL PROCESSING

TECHNICAL FIELD

Embodiments described herein are generally related to the field of circuit simulation in circuit modeling and fabrication. More specifically, embodiments described herein are related to reducing an overhead in massive parallel processing of a large integrated circuit simulation.

BACKGROUND

Signal electromigration (SEM) is a phenomenon that causes wires and other circuit elements to deteriorate with usage as current flows through them. Current circuit models include large numbers of components arranged in ever-smaller dimensions, requiring small wires and resistors to withstand large current densities, thereby enhancing the deleterious effects of SEM. Given the possible large sizes of simulations and simulation tasks for complex circuits including billions of components in a single chip, integrated circuit models simplify the assumptions of signal flow in a circuit, thereby generally overestimating SEM effects. This results in modeling decisions such as reducing component density and the like, which ultimately reduce the cost efficiency of circuit fabrication. Furthermore, oversimplification may result in overlooking certain signal combinations that may occur during circuit operation, which may result in catastrophic circuit failure, forcing a complete redesign of a circuit. Such an outcome is highly undesirable, at least because of the large cost of retooling manufacturing protocols at the foundry level as well as the missed market window opportunity cost.

The description provided in the background section should not be assumed to be prior art merely because it is mentioned in or associated with the background section. The background section may include information that describes one or more aspects of the subject technology.

SUMMARY

In a first embodiment, a computer-implemented method for simulating an integrated circuit model is described. The computer-implemented method includes receiving partition netlists of an integrated circuit in a partition scheduler and scheduling, by at least one computer, an execution of a computational thread associated with a first partition netlist of the partition netlists. The computer-implemented method also includes preparing an input data set for a first task of the computational thread and storing the input data set in an object storage, and providing the input data set to the at least one computer. Also, the computer-implemented method includes executing, by the at least one computer, the first task in the computational thread associated with the first partition netlist.

In a second embodiment, a system is described that includes a memory, storing instructions, and at least one processor that executes the instructions. When the processor executes the instructions, the system performs steps to receive partition netlists of an integrated circuit in a partition scheduler, schedule, by at least one computer within a networked computer environment, an execution of a computational thread associated with a first partition netlist of the partition netlists by the at least one computer, and prepare an input data set for a first task of the computational thread and storing the input data set in an object storage, wherein the input data set includes a plurality of input stimuli vectors for use as inputs to the first partition netlist. The system also performs steps to provide the input data set to the at least one computer, and execute, by the at least one computer, the first task in the computational thread associated with the partition netlist.

In yet another embodiment, a non-transitory, machine-readable storage medium is described that includes machine-readable instructions for causing a processor to execute a method. The method includes receiving partition netlists of an integrated circuit in a partition scheduler, and scheduling, by at least one computer within a networked computer environment, an execution of a computational thread associated with a first partition netlist of the partition netlists by the at least one computer. The method also includes preparing an input data set for a first task of the computational thread and storing the input data set in an object storage, wherein the input data set includes a plurality of input stimuli vectors for use as inputs to the first partition netlist. The method includes providing the input data set to the at least one computer, and executing, by the at least one computer, the first task in the computational thread associated with the partition netlist.

In a further embodiment, a system is described that includes a means for storing instructions and a means to execute the instructions to perform steps to receive partition netlists of an integrated circuit in a partition scheduler, schedule, by at least one computer within a networked computer environment, an execution of a computational thread associated with a first partition netlist of the partition netlists by the at least one computer, and to prepare an input data set for a first task in the computational thread and storing the input data set in an object storage, wherein the input data set includes a plurality of input stimuli vectors for use as inputs to the first partition netlist. The means to execute the instructions also performs steps to provide the input data set to the at least one computer, and execute, by the at least one computer, the first task in the computational thread associated with the partition netlist.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
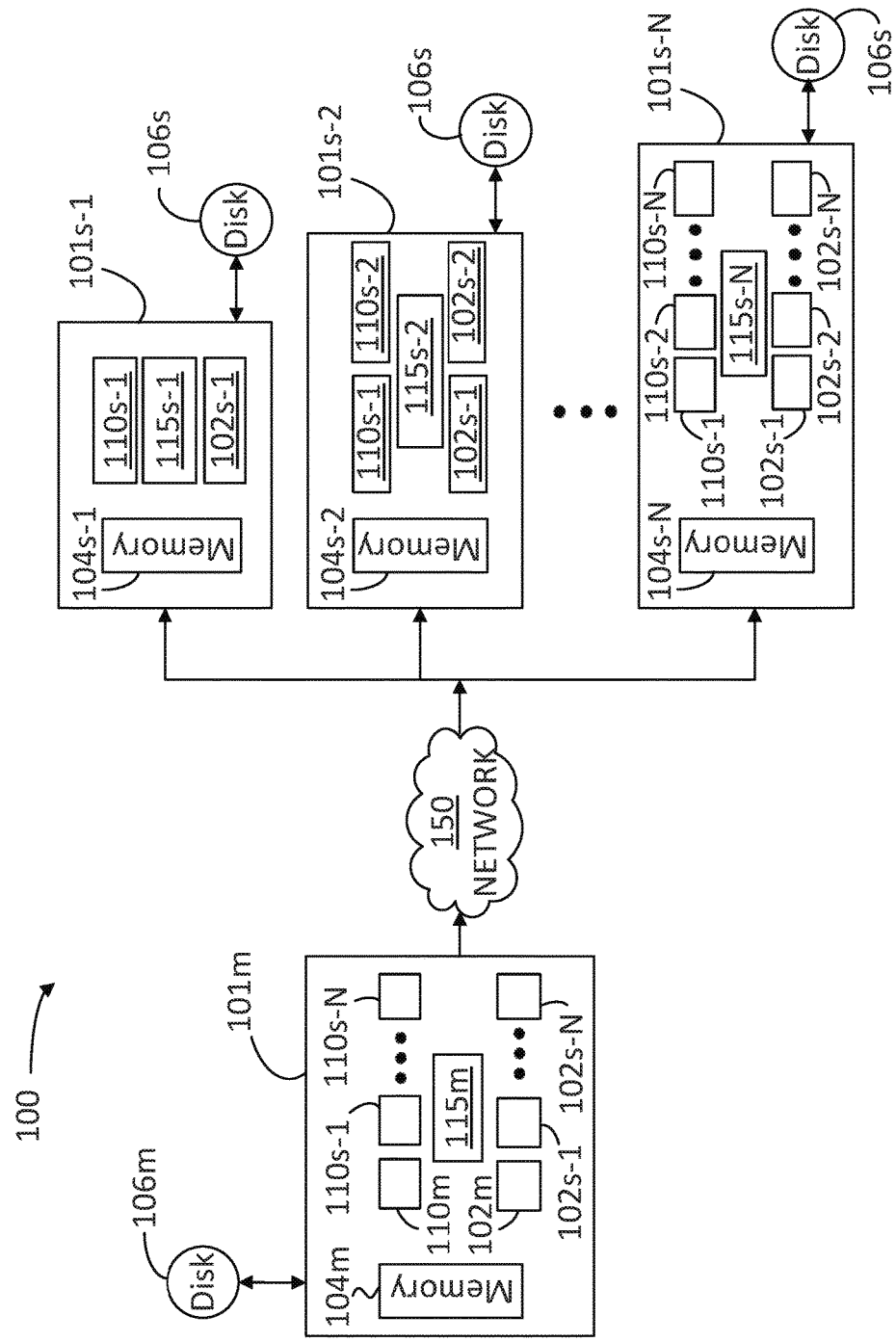
FIG. 1 is a block diagram of a cloud environment for integrated circuit (IC) modeling and characterization, according to some embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for reducing an overhead in a massive parallel processing of a large integrated circuit emulation.

The disclosed system addresses a technical problem tied to computer technology and arising in the realm of computer networks, namely the technical problem of efficient usage of multiple computer processing resources in a cloud environment for the purpose of obtaining a detailed integrated circuit modeling. The disclosed system solves this problem by partitioning a large circuit model into multiple, smaller circuit partitions that can be modeled efficiently using limited computational resources distributed in a network. For example, in some embodiments the limited computational resources include multiple servers forming the nodes of a network in a cloud environment. The system then re-groups the multiple resulting files from each circuit partition into an emulation file representing SEM effects for the entire circuit. Such an approach reduces the computational burden for each single server in a network node, increases the emulation speed of the large circuit model (e.g., in terms of CPU hour usage), and enables a more refined analysis of the large circuit model. A more refined analysis of an integrated circuit model may enable the identification of "critical paths" where performance is heavily dependent on the specific characteristic of circuit components along the critical path.

Massively distributed applications of parallel processing have two phases of work: a first phase to prepare input data sets and refresh resources (e.g., the parallel overhead), and a second phase to generate output data from the input data (e.g., "useful work"). As the scale of a massive application increases to a larger number of CPUs or central processing units, the work done in the first phase increases accordingly in terms of total CPU time, thereby reducing time efficiency of the circuit emulation. This work also impacts the total scalability of the application.

Methods as disclosed herein address the technical problem of reducing the parallel overhead by caching and reusing information and data generated during data preparation to reduce the parallel overhead and also to generate consistent results in scenarios where there are multiple correct outcomes (so running the program on multiple servers could possibly generate different sets of correct results leading to inconsistency which is not desired).

Embodiments of methods and systems as disclosed herein include static partitioning schemes having no inputs from the user. Some embodiments further include dynamic partitioning schemes including user inputs (e.g., input vectors, slew rate, frequency, and the like). In embodiments as disclosed herein, an IC model is represented by an IC netlist including circuit components and the wires connecting them. The IC netlist may include a graphical layout of the circuit and associated files including specifications for each of the circuit components and wires. In a dynamic partitioning scheme, the IC netlist may be partitioned differently depending on the user inputs. Each of the resulting partitions may use inputs and outputs from other circuits and other partitions as well. Once the partitioning is accomplished, an electromagnetic simulation for each partition is performed in a parallel computation scheme, such as encountered in cloud environments. Accordingly, a plurality of servers (e.g., master and slave servers) coupled through a network is configured to generate, share where desirable, and apply stimulus vectors to create appropriate current flows and identify electromigration effects in each of the partitions.

The disclosed system addresses another technical problem tied to computer technology and arising in the realm of massive parallel computation, namely the technical problem of preparing, storing, and accessing overhead resources in a cloud environment for simulating a large integrated circuit. Overhead resources include input/output files that may be used sequentially by different tasks in separate computational threads associated with different partitions of a large integrated circuit. Accordingly, many tasks may depend for their performance on input files resulting from other tasks within the same computational thread, or even from a separate computational thread. The disclosed system solves this problem by scheduling tasks across multiple circuit partitions so that overhead resources (input/output files) are available as soon as a processor is ready to start an associated task. This reduces the idle time of the servers, and enables a seamless assembly of multiple computational threads into a single integrated circuit simulation.

FIG. 1 is a block diagram of a cloud environment 100 for IC modeling and characterization, according to some embodiments. Cloud environment 100 may be a massive parallel architecture of computer servers including a master server 101$m$ and a plurality of slave servers 101$s$-1 through 101$s$-N (hereinafter collectively referred to as "slave servers 101$s$") coupled through a network 150, where N is an integer number. Hereinafter, master server 101$m$ and slave servers 101$s$ in cloud environment 100 will be collectively referred to as "servers 101." Without limitation, servers 101 form a network of machines in cloud environment 100 coupled through network 150. Network 150 can include, for example, any one or more of a personal area network (PAN), a local area network (LAN), a campus area network (CAN), a metropolitan area network (MAN), a wide area network (WAN), a broadband network (BBN), the Internet, and the like. Further, the network 150 can include, but is not limited to, for example, any one or more of the following network topologies, including a bus network, a star network, a ring network, a mesh network, a star-bus network, tree or hierarchical network, or the like.

Each of servers 101 includes a memory and an operating system. For example, master server 101$m$ includes memory 104$m$ and operating system 115$m$, and slave servers 101$s$ include memories 104$s$-1 through 104$s$-N (hereinafter collectively referred to as "memories 104"). Master server 101*m* may also include operating system 115*m*, and slave servers 101*s* may include slave operating systems 115*s*-1 through 115*s*-N (hereinafter, collectively referred to as "operating systems 115"). Master server 101*m* may also include application 110*m*, and slave servers 101*s* may include slave applications 110*s*-1 through 110*s*-N (hereinafter, collectively referred to as instances of "application 110"). Slave applications 110*s*-1 through N include copies of master application software 110*m*. Master server 101*m* may keep separate mirror images of slave applications 110*s*, associated with independent portions of master memory 104*m*. Memories 104, application software 110 and operating systems 115 are configured to store commands to be executed by processors 102*m* and 102*s*-1 through 102*s*-N (hereinafter collectively referred to as "processors 102") to perform at least partially methods as disclosed herein. Processors 102 may include multiple parallel processors configured to perform computation tasks simultaneously or nearly simultaneously independently of each other. Servers 101 may be coupled with external disks to save and retrieve data, such as disk 106*m* for master server 101*m*, and disks 106*s* for slave servers 101*s* (hereinafter, collectively referred to as "disks 106").

Master application 110*m* is the main instance of application 110 and may be initially executed by a user having access to master server 101*m* (e.g., through network 150). Master application 110*m* is configured to instantiate and control execution of slave applications 110*s*. For example, in some embodiments master application 110*m* provides suitable initialization routines to place each of slave applications 110*s* in a desired state to start a simulation run, and provides suitable tasks for each of slave applications 110*s*. The tasks may correspond to sequences or computational threads separately performed by each of slave applications 110*s*. Further, master application 110*m* is configured to collect the computation results from each of slave applications 110*s*, when available. Note that, in the architecture of cloud environment 100, master server 101*m* has created two instances of slave application 110*s*-1 and 110*s*-2 in slave server 101*s*-2, and up to N instances of slave applications 110*s*-1 through 110*s*-N in slave server 101*s*-N. The multiple instances of slave applications 110*s* in each of slave servers 101*s* may be executed independently of one another. For example, slave servers 101*s*-1 through 101*s*-N may be configured to perform a first computational thread in slave application 110*s*-1, slave servers 101*s*-2 through 102*s*-N may be configured to perform a second computational thread in slave application 110*s*-2, and so on. The results and data for each of the tasks in the first, second, and other computational threads are communicated to and from master server 101*m*, through network 150, to each of the corresponding slave servers 101*s*. Moreover, in some embodiments slave servers 101*s* may communicate with each other through network 150 to share data and results within commonly executed computational threads. For example, slave server 101*s*-1 may communicate with slave server 101*s*-2 data associated with the first computational thread, and so on.

Figure 2:
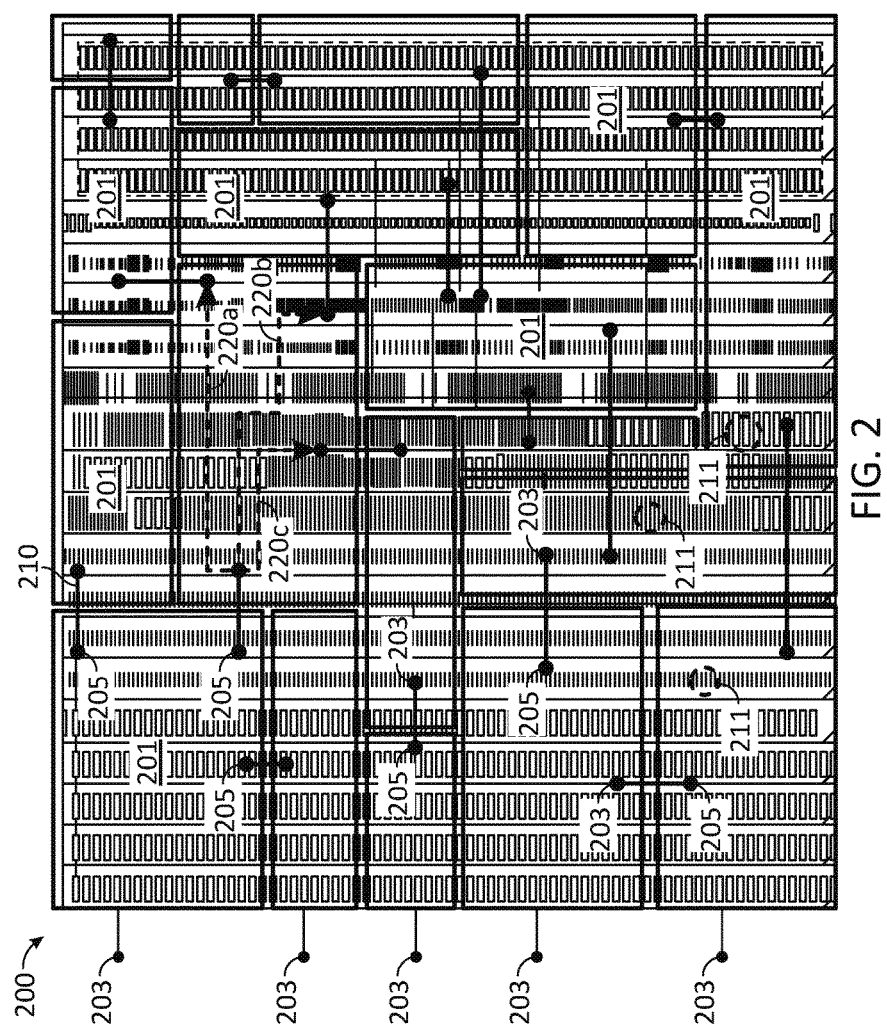
FIG. 2 illustrates partitions of an IC model for signal electro-migration analysis, according to some embodiments.

FIG. 2 illustrates partitions 201 of an IC netlist 200 for signal electro-migration analysis, according to some embodiments. IC netlist 200 represents an IC model including multiple components 211 that may include transistors, resistors, capacitors, inductors, and the wires coupling them. As a non-limiting example, components 211 may include metal-oxide-semiconductor (MOS) transistors such as N-type MOS (NMOS) transistors, P-type MOS (PMOS) transistors, field-effect (FET) transistors, fin FET (FinFET) transistors, and the like. Each partition 201 includes multiple components 211, at least one input 203 and at least one or more outputs 205. Input 203 may be coupled to an external signal, or to a signal provided by output 205 from another partition 201. In some embodiments, partitions 201 that are non-adjacent may also be coupled through wires 210 in an output/input configuration. In some embodiments, partitioning of IC netlist 200 is performed so that input/output coupling between different partitions 201 through wires 210 occurs across adjacent partitions 201. Accordingly, it is desirable that wires 210 coupling different partitions 201 be shortened to avoid undue time-lag, loss, capacitive effects and other undesirable effects that reduce signal performance. By reducing deleterious effects in signal performance, overall current intensity through wires 210 is desirably kept at lower values, thus reducing the intensity of SEM effects in the IC model.

Each partition 201 further includes at least one signal path 220*a*, 220*b*, or 220*c* (hereinafter, collectively referred to as signal paths 220) joining an input 203 to an output 205. Signal paths 220 couple multiple circuit elements sequentially in time and may be logically independent from one another. In some embodiments, signal paths 220 may have a degree of logical coupling, forming a tree wherein a trunk may branch out into multiple signal paths within partition 201. In some embodiments, multiple signal paths may converge into a single path leading into an output 205. Convergence of multiple signal paths 220, or branching out of multiple signal paths 220 are features that may have an impact in SEM of the wires and other elements along signal paths 220. For example, configurations in which all converging signals in a tree include a "high" state ('1') tend to increase the current level in the converging signal path, thereby enhancing SEM effects at least for a period of time. In some embodiments, one of signal paths (e.g., signal path 220*b*) may be designated as a "critical path," wherein the time it takes a signal to traverse partition 201 from input 203 to output 205 in path 220*b* is the longest for any of signal paths 220. A size of a partition 201 may be associated to the number of circuit elements (e.g., resistors, transistors, capacitors, inductors and the like) in the partition, the number of signal paths in the partition, the number of inputs 203 and outputs 205 in the partition, or the length (in time or in distance) of critical path 220*b*. Each signal path 220 may involve a separate simulation step.

Figure 3:
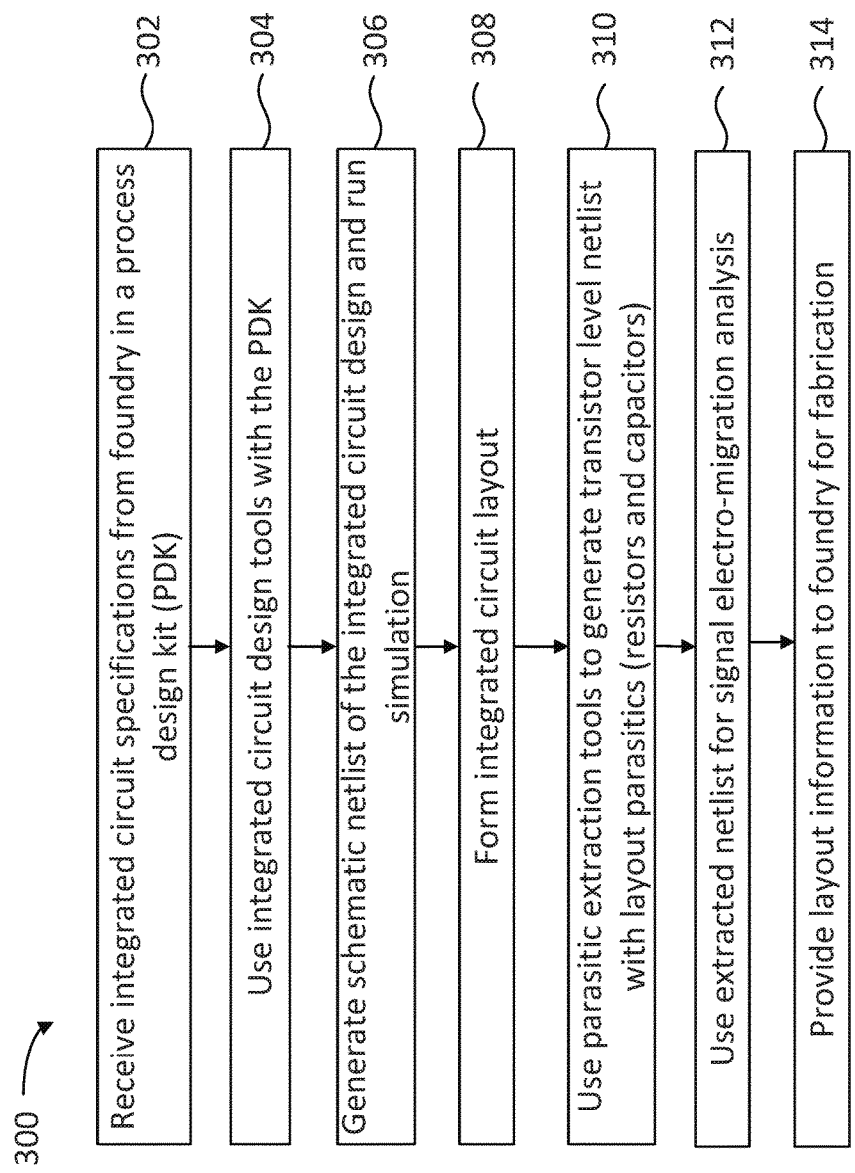
FIG. 3 is a flowchart including steps in a method for IC modeling and characterization according to some embodiments.

FIG. 3 illustrates a flowchart including steps in a method 300 for IC modeling and characterization according to some embodiments. At least some of the steps in method 300 may be performed by a computer having a processor executing commands stored in a memory of the computer. Further, steps as disclosed in method 300 may include retrieving, editing, and/or storing files in a database that is part of, or is communicably coupled to, the computer. Methods consistent with the present disclosure may include at least some, but not all of the steps illustrated in method 300, performed in a different sequence. Furthermore, methods consistent with the present disclosure may include at least two or more steps as in method 300, performed overlapping in time, or almost simultaneously.

In some embodiments, at least one or more of the steps in method 300 may be performed in cloud computing environment 100, wherein the computer may include servers 101, such as a master server 101*m* and a slave servers 101*s*. Accordingly, at least some of the steps illustrated in method 300 may be performed in parallel in different processors 102, following separate computational threads. For example, each of the separate computational threads may be performed by at least one of slave servers 102*s* in each of the applications 110s and processors 102s dedicated to the specific computational thread.

In some embodiments, master processor 101m is configured to provide slave processor 101s with an initialization routine to perform at least one of the steps in method 300, and to control an execution of at least one of the steps in method 300 by slave processor 102s. Furthermore, a first processor 102 may partially perform at least one of the steps of method 300 in a first computational thread and a second processor 102 may partially perform at least a second one of the steps of method 300 in a second computational thread.

Step 302 includes receiving IC specifications from a foundry. In some embodiments, step 302 may include retrieving a "process development kit" (PDK) file from the foundry, wherein device specifications are listed as functions of independent random variables that a designer may use to develop statistical analysis of the IC performance.

Step 304 includes using IC design tools together with the PDK to generate an IC model. In some embodiments, step 304 includes selecting a characterization tool for the IC modeling task. In some embodiments, step 304 may include selecting a tool from a platform for characterizing multiple IC blocks such as standard cells, memories, mixed signal blocks for timing, variation, signal integrity, power and electro-migration, among other features of IC design.

Step 306 includes generating a schematic netlist of the integrated circuit design and running a simulation of the schematic netlist. In some embodiments, step 306 includes generating an IC model as IC netlist 200. In some embodiments, step 306 includes generating a register transfer level (RTL) model of the IC.

Step 308 includes forming the integrated circuit layout.

Step 310 includes using parasitic extraction tools to generate a transistor level netlist with layout parasitics. In some embodiments, the layout parasitics may include effects from resistors and capacitors in the netlist simulation.

Step 312 includes using the extracted netlist for a signal electro-migration (SEM) analysis. In some embodiments, step 312 includes transferring the extracted netlist to a parallel architecture for SEM analysis. The parallel architecture may include master server 101m and slave servers 101s coupled through network 150. In some embodiments, step 312 includes separating IC netlist 200 into partitions 201, and separating multiple simulation tasks in computational threads across each of the different partitions 201. For example, a computational thread in cloud environment 100 may be associated with a specific partition 201. This procedure enables efficient and accurate dynamic simulation of partitions 201 (e.g., through simulation tools such as "SPICE" and the like). To separate multiple simulation tasks across each of the different partitions 201, step 312 may include preparing input data files for each of the tasks in the computational threads associated with each of partitions 201. In some embodiments, step 312 also includes combining multiple computational thread results from multiple partitions 201 into a single SEM database for the entire IC netlist 200. The single SEM database may include a single file, or a cluster of files associated with IC netlist 200, wherein a user may determine SEM characteristics of any portion of IC netlist 200. In some embodiments, step 312 may include providing an electromigration report for IC netlist 200 to the foundry. The electromigration report may include the electromigration performance of the plurality of components 211 in IC netlist 200, including expected lifetimes for components 211. The electromigration report may further include statistical analysis of the expected electromigration lifetimes of different components 211, according to multiple random fabrication variables provided by the foundry in the PDK file.

Step 314 includes providing the layout information to a foundry, to fabricate the integrated circuit. Based on the layout information, the foundry may decide to revise a device specification, such as modified operational conditions (e.g., environmental operation conditions, and the like). In some configurations, the foundry may decide to modify the IC model when certain performance specifications (e.g., SEM lifetime) fall out of an acceptable range.

Figure 4:
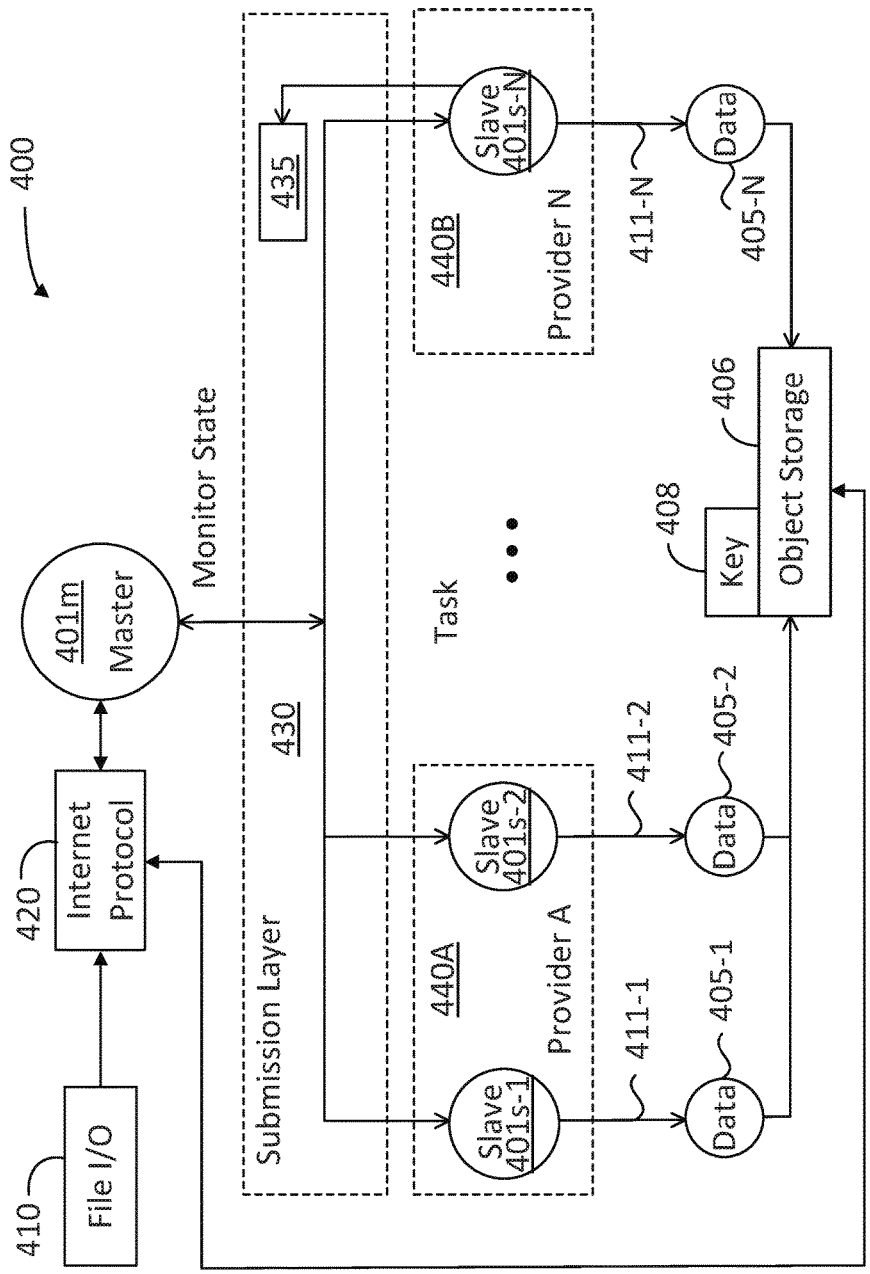
FIG. 4 illustrates a cloud environment for IC modeling and characterization, according to some embodiments.

FIG. 4 illustrates a cloud environment 400 for IC modeling and characterization, according to some embodiments. In cloud environment 400 a master server 401m controls an internet protocol 420 and a file input/output resource 410. A plurality of slave servers 401s-1 to 401s-N (hereinafter collectively referred to as slave servers 401s) may be distributed across multiple service providers 440A and 440B (hereinafter, collectively referred to as service providers 440). Cloud environment 400 may include at least a part of cloud environment 100, so that master server 401m may include at least a part of master server 101m as detailed above, in the context of cloud environment 100. Likewise, any one of slave servers 401s may include at least partially any one of slave servers 101s as detailed in the context of cloud environment 100. Slave servers 401s are configured to execute tasks 411-1 through 411-N (hereinafter collectively referred to as "tasks 411") associated with computational threads in the parallel processing of multiple partition netlists for signal electromigration analysis of an IC model. In some embodiments, tasks 411 are executed by each of slave servers 401s running applications installed by master server 401m (e.g., applications 110).

Master server 401m communicates with slave servers 401s through submission layer 430. Submission layer 430 may also be accessed by any one of slave servers 401s to communicate and exchange data with one another. Master server 401m may use submission layer 430 to monitor the state of the different computational threads assigned to each of slave servers 401s.

An object storage 406 may also be configured to store at least part of applications 110 and associated resources so that slave servers 401s execute tasks 411. Master server 401m may access object storage 406 via an encrypted key 408, through internet protocol 420. In some embodiments, master server 401m ensures that the state of applications 110 remains unchanged after execution of tasks 411, for each of slave servers 401s. For example, when a slave application 110s-i in object storage 406 is altered after execution of a task 411-i, master server 401m restores application 110s-i to its original state. Accordingly, master server 401m enables a reproducible and recoverable execution of tasks 411 in cloud environment 400. When one of slave servers 401s has completed a task 411 in a computational thread (e.g., slave server 401s-N), or has completed the computational thread altogether, a "status ready" message 435 is passed through submission layer 430 from one of slave servers 401s to master server 401m. A task 411-i may be associated with a computational thread scheduled by master server 401m to be performed by a slave server 401s-i (where "i" is any integer between 1 and N). A data set 405-i (collectively referred hereinafter to as data sets 405) resulting from task 411-i, is stored in object storage 406. In some embodiments, master server 401m schedules tasks 411 to be executed by slave servers 401s so that data sets 405 are available in object storage 406 to other slave servers 401s that may use the data set for their specific task.

In some embodiments, master server 401m is configured for preparing, storing, updating, and allowing slave servers 401s access to, overhead resources in object storage 406. Overhead resources stored in object storage 406 include input/output files handled through file I/O resource 410. Input/output files in object storage 406 may be used sequentially by different tasks in separate computational threads associated with different partitions 201 of IC netlist 200. In some embodiments, data sets 405 include at least some input/output files. Accordingly, many tasks may depend for their performance on input files resulting from other tasks within the same computational thread, and stored in object storage 406. In some embodiments, files stored in object storage 406 and created by a slave server 401s-i as a result of task 411-i in a first computational thread may be used by a second slave server 401s-j performing a task 411-j a second computational thread (wherein "i" and "j" are any integers between 1 and N). Accordingly, master server 401m is configured to schedule tasks 411-i and 411-j so that slave server 401s-j is ready to start task 411-j as soon as task 411-i is finished. Moreover, in some embodiments master server 401m is configured to reduce the idle time of slave server 401s j. Further, master server 401m may be configured to update and convert input/output files in object storage 406 so that different slave servers 401s-i and 401s-j can use the input/output files across a submission layer 430 to enable a seamless assembly of multiple computational threads into a single integrated circuit simulation.

In some embodiments, object storage 406 is a database including tags, files, images, libraries and any other data that may be an output or an input of any one of tasks 411. Data is stored in object storage 406 by an authorized user (e.g., master server 401m or any one of slave servers 401s) with encrypted key 408. In some embodiments, when a task 411-i is completed slave server 401s-i is placed on hold until the a parallel task in the same or related computational thread is completed, and the state of an application 110s-i in slave server 401s-i is refreshed by master server 401m. Then, a new task may be carried out by slave server 401s-i, seamlessly (wherein "i" is any integer between 1 and N). The new task may be the same task 411-i, reproducing the same data set 405-i, or a different task, or the same task with a different input data.

When slave server 401s-i completes task 411-i, it pushes output data set 405-i to object storage 406. Master server 401m may then retrieve output data set 405 from object storage 406. In some embodiments, master server 401m periodically scans object storage 406 to search for new output data sets 405 that may have been stored within. When one of slave servers 401s crashes (e.g., slave server 401s-i), or otherwise becomes dysfunctional or unavailable (due to being outbid by a competing request), master server 401m replaces it with a new slave server (e.g., slave server 401s j, wherein "j" is an integer greater than N) to ensure a fixed number of slave servers N is operational to execute the computational threads.

In some embodiments, object storage 406 may be included in any one of service providers 440, or it may be local to master server 401m. Further, in some embodiments object storage 406 may be at least partially installed in a separate server within cloud environment 400. Encrypted key 408 may include multiple keys specifically restricted for certain servers (e.g., master server 401m and or any one or all of slave servers 401s). Therefore, object storage 406 enables a seamless transition from an in-house simulation application to a massively parallel computation in cloud environment 400.

For example, and without limitation, data set 405-i resulting from task 411-i in slave server 401s-i may be retrieved from object storage 406 by master server 401m and sent to slave server 401s-j as input data for performing task 411-j (wherein i and j are different integers, between 1 and N). In such circumstance, master server 401m may schedule the execution of computational threads in slave servers 401s-i and 401s-j so that slave server 401s-j is not idle while slave server 401s-i completes task 411-i. Master server 401m determines which task 411 is performed by which slave server 401s, and in which order in a computational thread sequence. According to embodiments as disclosed herein, master server 401m schedules the performance of tasks 411 by servers 401s to reduce or minimize idle lapses of time during which slave server 401s-j waits for slave server 401s-i to complete task 411-i and provide data set 405-i as input to task 411-j.

Figure 5:
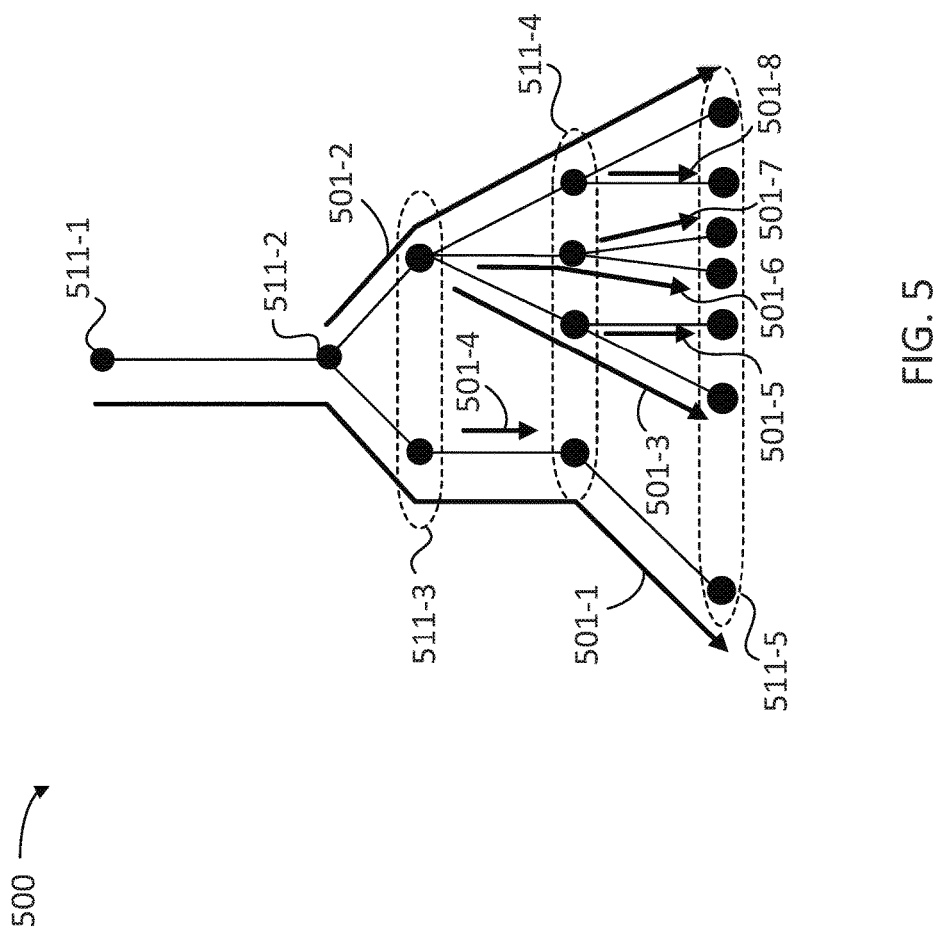
FIG. 5 illustrates a dependency tree for tasks in a parallel processing environment, according to some embodiments.

FIG. 5 illustrates a dependency tree 500 for tasks in a parallel processing environment, according to some embodiments. Dependency tree 500 includes tasks 511-1, 511-2, 511-3, 511-4, and 511-5 (hereinafter, collectively referred to as tasks 511) distributed sequentially along computational threads 501-1, 501-2, 501-3, 501-4, 501-5, 501-6, 501-7, and 501-8. Tasks 511 are arranged in order of execution in the overall parallel computation scheme to simulate at least multiple partitions 201 in IC netlist 200. For example, task 511-1 may be the first task to be executed, and task 511-2 may be executed using a data set resulting from the execution of task 511-1. Likewise any one of tasks 511-3 (two tasks illustrated in dependency tree 500) may be executed using data sets resulting from the execution of task 511-2, and any one of tasks 511-4 (four tasks illustrated in dependency tree 500) may be executed after one of the two tasks 511-3 are executed. By the same token, any one of tasks 511-5 (seven tasks illustrated in dependency tree 500) may be executed using a data set resulting from the execution of one of the four tasks 511-4.

Dependency tree 500 may substantially reduce the input/output data overhead in the parallel processing environment. In some embodiments the parallel processing includes and caching information that may be necessary for a specific task 511-3 (e.g., in computational thread 501-1), which may be reusable by the specific task 511-3 when such information is unavailable from previously computed tasks (e.g., a task 511-3 in computational thread 501-2), according to dependency tree 500.

In some embodiments, dependency tree 500 is used to schedule execution of tasks 511 so that idle time for each of the servers executing the tasks is reduced or minimized. Furthermore, in some embodiments dependency tree 500 is modified dynamically to accommodate for new tasks, or for changes in the network of servers that are available from the cloud environment. For example, one or more slave servers may be lost (e.g., non-responsive) due to an operating system crash, or a timeout default, or any other error condition. Accordingly, the execution of tasks 511 may be changed to include fewer or more nodes in dependency tree 500. In some embodiments, the master server may decide to re-locate the task assignment for at least one of the slave servers in view of certain network conditions (e.g., connectivity issues or network traffic). In some embodiments, the master server ensures that tasks 511 begin execution only when all associated input data sets for the task are available to the one or more slave servers scheduled to execute the task. The input data sets for each task may be retrieved by the master server with the encrypted key, pushed into the scheduled slave servers to be stored in a memory, and uploaded to the specific application executing the task (e.g., memories 104s, and applications 110s).

Figure 6:
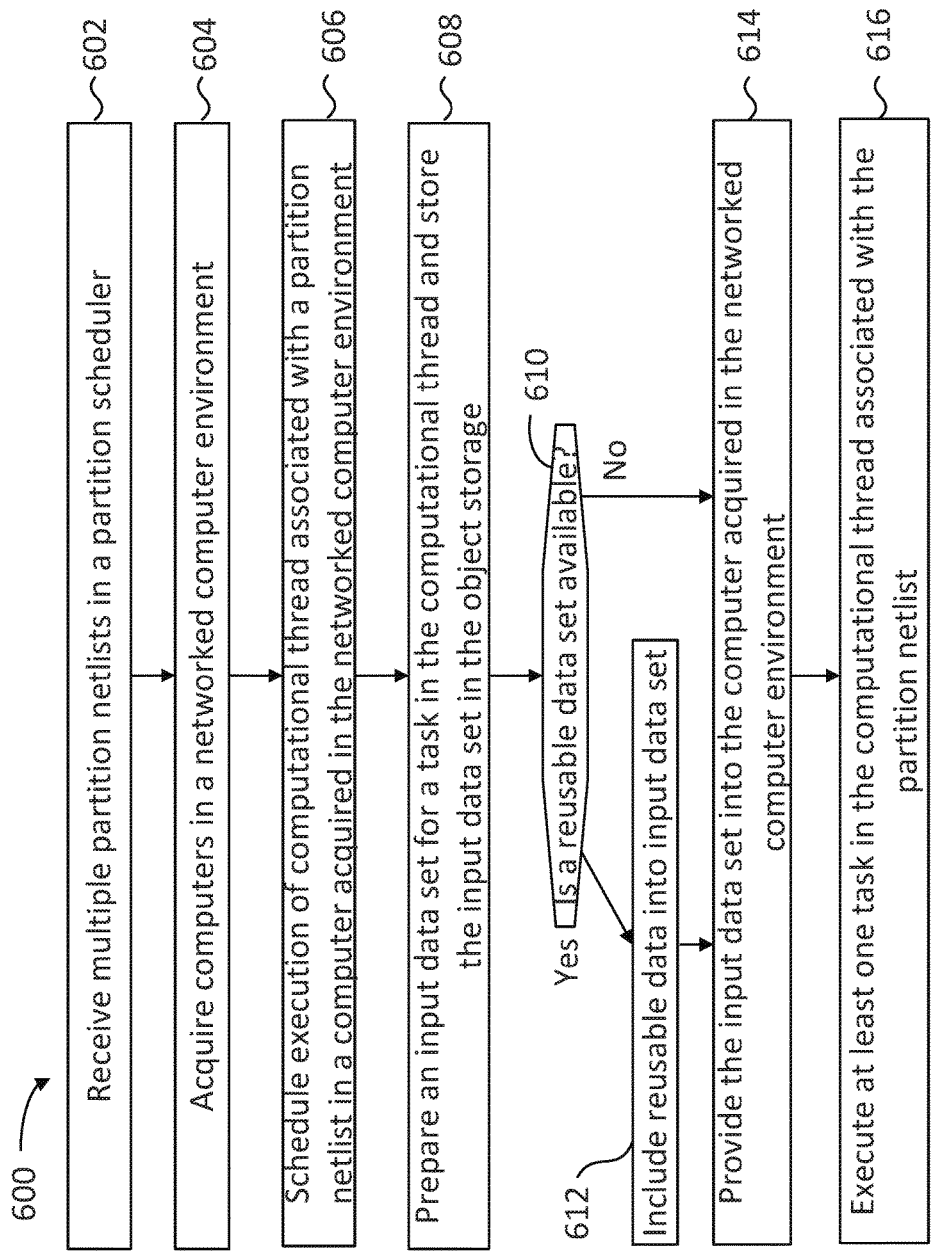
FIG. 6 is a flowchart including steps for reducing overhead in parallel processing of multiple partitions for signal electro-migration analysis, according to some embodiments

FIG. 6 is a flowchart including steps for reducing overhead in parallel processing of multiple partitions for signal electro-migration analysis, according to some embodiments. At least some of the steps in method 600 may be performed by a computer having a processor executing commands stored in a memory of the computer. Further, steps as disclosed in method 600 may include retrieving, editing, and/or storing files in a database that is part of, or is communicably coupled to, the computer. Methods consistent with the present disclosure may include at least some, but not all of the steps illustrated in method 600, performed in a different sequence. Furthermore, methods consistent with the present disclosure may include at least two or more steps as in method 600 performed overlapping in time, or almost simultaneously.

In some embodiments, at least one or more of the steps in method 600 may be performed in cloud environment 100 or in cloud environment 400, wherein the computer may include servers 101 (or 401), such as a master server 101m, 401m and slave servers 101s or 401s. Furthermore, the cloud environment in method 600 may include an object storage wherein data sets that are inputs or outputs of tasks may be stored for use by one or more servers (e.g., object storage 406, tasks 411, and data sets 405). The object storage may be accessible to one or more of servers 101 through an encrypted key (e.g., encrypted key 408). Accordingly, at least some of the steps illustrated in method 600 may be performed in parallel in different processors 102, following separate computational threads. For example, each of the separate computational threads may be performed by at least one of slave servers 102s in each of applications 110s and processors 102s dedicated to a specific computational thread or a specific task in the computational thread.

In some embodiments, master processor 101m is configured to provide slave processor 101s with an initialization routine to perform at least one of the steps in method 600, and to control an execution of the at least one of the steps in method 600 by slave processor 102s. Furthermore, a first processor 102 may partially perform at least one of the steps of method 600 in a first computational thread and a second processor 102 may partially perform at least a second one of the steps of method 600 in a second computational thread.

In some embodiments, at least one processor 102 may include master processor 102m and slave processor 102s coupled through network 150. Master processor 102m may be configured to provide slave processor 102s with an initialization routine to execute at least one portion of the instructions, and to control an execution of the at least one portion of the instructions by slave processor 102s. A processor 102 may include a first processor (master or slave) partially executing at least one portion of the instructions in a first computational thread and a second processor 102 (master or slave) partially performing at least a second portion of the instructions in a second computational thread. Processor 102 may include master processor 102m configured to provide IC netlist 200 to at least one slave processor 102s, and the at least one slave processor 102s executes the instructions to perform at least some of the steps in method 600. In reference to the different steps in method 600, servers 101 and 401 (master and slave), will be generically referred to in the singular as "computer" and in the plural as "computers," without distinction or limitation. Furthermore, in reference to the different steps in method 600, a cloud environment will be generically referred to as a networked computer environment, without distinction or limitation.

Step 602 includes receiving multiple partition netlists in a partition scheduler, each of the partition netlists including at least one circuit component. In some embodiments, step 602 may include generating an IC netlist, and partitioning the IC netlist into one or more partitions.

Step 604 includes acquiring computers in the networked computer environment. In some embodiments, step 604 includes bidding for computers in the cloud environment. Accordingly, step 604 may include real-time biding for the computers. Certain partitions may be assigned to certain types of computers based on speed, memory, and other capabilities, including cost effective issues. Step 604 includes verifying whether at least one computer in the cloud environment was acquired. When no computer was acquired in the cloud, step 604 includes continue bidding for available computers in the cloud environment.

Step 606 includes scheduling the execution of computational thread associated with a partition netlist in at least one computer acquired from the networked computer environment. In some embodiments, step 606 includes scheduling the execution of a first task in the computational thread associated with the partition netlist in a first computer acquired from the networked computer environment. Further, step 606 may include scheduling execution of a second task in the computational thread associated with the partition netlist in a second computer acquired from the networked computer environment. In some embodiments, step 606 may include scheduling execution of multiple tasks associated with multiple computational threads for multiple partition netlists, in multiple computers acquired from the networked computer environment. In some embodiments, step 606 includes scheduling the execution of the first task in the computational thread before the execution of a second task in the computational thread when an output data set from the first task is used as an input data set for the second task. In some embodiments, step 606 includes scheduling a parallel execution of a first and a second computational thread that are independent from each other. In some embodiments, step 606 includes re-assigning at least one task on the computational thread to the at least one computer when a second computer in the networked computer environment is nonresponsive. In yet other embodiments, step 606 includes forming a dependency tree mapping a plurality of computational threads comprising a plurality of sequentially executed tasks, and assigning independent computational threads to separate computers available in the cloud environment. Further, in some embodiments step 606 includes forming a dependency tree associating the partition netlists with a plurality of computational threads, wherein each of the computational threads forms a branch in the dependency tree. A branch in the dependency tree may include a plurality of sequentially executed tasks.

Step 608 includes preparing an input data set for a task in the computational thread and storing the input data set in the object storage. In some embodiments, step 608 may include providing the encrypted key to access the object storage to the at least one acquired computer that will execute the task. In some embodiments, step 608 includes identifying a reusable data set in the object storage. In some embodiments, step 608 includes scanning the object storage to include reusable data in the input data set. In some embodiments, step 608 includes making a plurality of copies of the input data set for each of a plurality of computers executing parallel computational threads. The reusable data may include at least one of an output data set or an input data set from a second task in a second computational thread, wherein the second computational thread may be the same as, or independent from, the computational thread for the original task.

Step 610 includes verifying whether reusable data is available for executing at least one task in the acquired computer. In some embodiments, step 610 may include scanning, with the master server, the object storage to find at least one data set that may be used, or reused, as an input by a task scheduled for execution in one of the slave servers. A reusable data may include, for example and without limitation, a logic state of an input circuit component in the partition netlist. More generally, a reusable data set includes reusable data and is the input data set for a second task from a second computational thread, wherein the second computational thread may be the same, or different from the first computational thread. Accordingly, a reusable data set may be a data set that is the output of a previously executed task, or a data set that has been used by a previously executed task. When at least one data set is reusable, step 612 includes adding the reusable data into the input data set.

Step 614 includes providing the input data set in the acquired computer from the networked computer environment. Step 612 may include loading the data in a memory of the acquired computer for execution of the task.

When no reusable data is available, or when the reusable data has been loaded into the computer acquired in the networked computer environment, step 614 includes loading the input data set into the computer acquired in the networked computer environment. In some embodiments, step 614 may include pushing the input data set from the object storage to a memory or an application in the computer acquired from the networked computer environment.

Step 616 includes executing at least one task in the computational thread associated with the partition netlist. In some embodiments, step 616 includes determining an induced current in at least one circuit component from the partition netlist.

Figure 7:
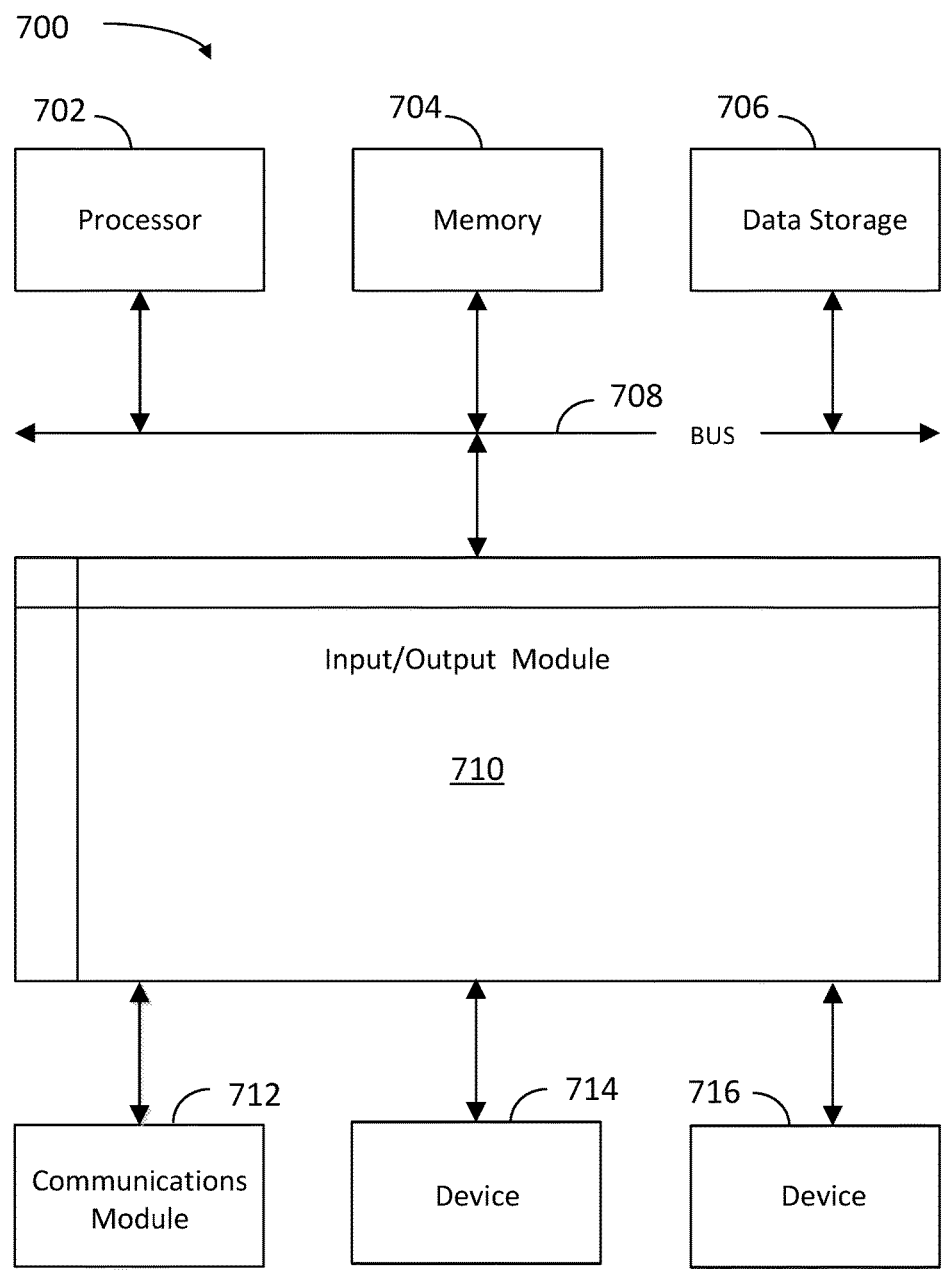
FIG. 7 is a block diagram illustrating an example computer system that includes a design tool, according to some embodiments.

FIG. 7 is a block diagram illustrating an example computer system 700 with which the methods and steps illustrated in FIGS. 1-6 can be implemented, according to some embodiments. In certain aspects, computer system 700 can be implemented using hardware or a combination of software and hardware, either in a dedicated server, integrated into another entity, or distributed across multiple entities.

Computer system 700 includes a bus 708 or other communication mechanism for communicating information, and a processor 702 coupled with bus 708 for processing information. By way of example, computer system 700 can be implemented with one or more processors 702. Processor 702 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 702 may include modules and circuits configured as a 'placing' tool or engine, or a 'routing' tool or engine, to place devices and route channels in a circuit layout, respectively and as disclosed herein.

Computer system 700 includes, in addition to hardware, code that creates an execution environment for the computer program in question, e.g., code that constitutes processor firmware, a protocol stack, a database management system, an operating system, or a combination of one or more of them stored in an included memory 704, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 708 for storing information and instructions to be executed by processor 702. Processor 702 and memory 704 can be supplemented by, or incorporated in, special purpose logic circuitry.

The instructions may be stored in memory 704 and implemented in one or more computer program products, e.g., one or more modules of computer program instructions encoded on a computer readable medium for execution by, or to control the operation of, the computer system 700, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 704 may also be used for storing temporary variable or other intermediate information during execution of instructions to be executed by processor 702.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 700 further includes a data storage device 706 such as a magnetic disk or optical disk, coupled to bus 708 for storing information and instructions.

Computer system 700 is coupled via input/output module 710 to various devices. The input/output module 710 is any input/output module. Example input/output modules 710 include data ports such as USB ports. The input/output module 710 is configured to connect to a communications module 712. Example communications modules 712 include networking interface cards, such as Ethernet cards and modems. In certain aspects, the input/output module 710 is configured to connect to a plurality of devices, such as an input device 714 and/or an output device 716. Example input devices 714 include a keyboard and a pointing device, e.g., a mouse or a trackball, by which a user can provide input to the computer system 700. Other kinds of input devices 714 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 716 include display devices, such as a LED (light emitting diode), CRT (cathode ray tube), or LCD (liquid crystal display) screen, for displaying information to the user.

Methods as disclosed herein may be performed by computer system 700 in response to processor 702 executing one or more sequences of one or more instructions contained in memory 704. Such instructions may be read into memory 704 from another machine-readable medium, such as data storage device 706. Execution of the sequences of instructions contained in main memory 704 causes processor 702 to perform the process steps described herein (e.g., as in methods 300 and 600). One or more processors in a multi-processing arrangement may also be employed to execute the sequences of instructions contained in memory 704. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., communication network 150. For example, some aspects of the subject matter described in this specification may be performed on a cloud-computing environment. Accordingly, in certain aspects a user of systems and methods as disclosed herein may perform at least some of the steps by accessing a cloud server through a network connection. Further, data files, circuit diagrams, performance specifications and the like resulting from the disclosure may be stored in a database server in the cloud-computing environment, or may be downloaded to a private storage device from the cloud-computing environment.

Computing system 700 includes servers and personal computer devices. A personal computing device and server are generally remote from each other and typically interact through a communication network. The relationship of client and server arises by virtue of computer programs running on the respective computers and having a client-server relationship to each other. Computer system 700 can be, for example, and without limitation, a desktop computer, laptop computer, or tablet computer. Computer system 700 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 702 for execution. Such a medium may take many forms, including, but not limited to, non-volatile media, volatile media, and transmission media. Non-volatile media include, for example, optical disks, magnetic disks, or flash memory, such as data storage device 706. Volatile media include dynamic memory, such as memory 704. Transmission media include coaxial cables, copper wire, and fiber optics, including the wires that comprise bus 708. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some," refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A computer-implemented method for simulating an integrated circuit model, comprising:

receiving, from a circuit design tool, partition netlists of an integrated circuit in a partition scheduler of a characterization tool;

scheduling, by at least one computer, an execution of a computational thread associated with a first partition netlist of the partition netlists;

preparing an input data set for a first task of the computational thread in a slave application, and storing the input data set in an object storage;

providing the input data set to the at least one computer;

executing, by the at least one computer in the circuit design tool, the first task in the computational thread associated with the first partition netlist; and restoring a state of the computer in the characterization tool when the slave application in the object storage of the characterization tool is altered in the execution of the first task.

2. The computer-implemented method of claim 1, wherein scheduling an execution of the computational thread associated with the first partition netlist comprises scheduling the execution of the first task in the computational thread before the execution of a second task in the computational thread when an output data set from the first task is used as an input data set for the second task.

3. The computer-implemented method of claim 1, wherein scheduling an execution of the computational thread comprises scheduling a parallel execution of a first and a second computational threads that are independent from each other.

4. The computer-implemented method of claim 1, wherein preparing an input data set for the first task in the computational thread comprises:

forming a plurality of input stimuli vectors for use as inputs to the first partition netlist, and identifying a reusable data set in the object storage, wherein the reusable data set is the input data set for a second task from a second computational thread independent from the first task.

5. The computer-implemented method of claim 1, wherein preparing an input data set for a first task in the computational thread comprises identifying a reusable data comprising at least one of an output data set or an input data set from a second task in a second computational thread.

6. The computer-implemented method of claim 1, wherein scheduling an execution of the computational thread associated with a first partition netlist in the at least one computer comprises:

forming a dependency tree associating the partition netlists with a plurality of computational threads, wherein each of the computational threads forms a branch in the dependency tree, the branch comprising a plurality of sequentially executed tasks; and assigning independent computational threads to separate computers available in a networked computer environment, wherein the networked computer environment comprises a plurality of computers.

7. The computer-implemented method of claim 6, wherein scheduling an execution of the computational thread associated with the first partition netlist in the at least one computer comprises re-assigning at least one task on the computational thread to the at least one computer when a second machine in the networked computer environment is non-responsive.

8. The computer-implemented method of claim 6, wherein preparing an input data set for a first task in the computational thread comprises making a plurality of copies of the input data set and providing one of the plurality of copies of the input data set to each of a plurality of computers executing parallel computational threads in the networked computer environment.

9. The computer-implemented method of claim 1, wherein executing the first task in the computational thread associated with the partition netlist comprises determining an induced current in at least one circuit component from the partition netlist and determining an electromigration effect of the induced current in the at least one circuit component.

10. A system, comprising:
a memory, storing computer code; and
at least one processor that executes the computer code to:
receive, from a circuit design tool, partition netlists of an integrated circuit in a partition scheduler of a characterization tool;
schedule, by at least one computer within a networked computer environment, an execution of a computational thread associated with a first partition netlist of the partition netlists by the at least one computer;
prepare an input data set for a first task of the computational thread in a slave application, and storing the input data set in an object storage, wherein the input data set comprises a plurality of input stimuli vectors for use as inputs to the first partition netlist;
provide the input data set to the at least one computer;
execute, by the at least one computer in the circuit design tool, the first task in the computational thread associated with the partition netlist; and
restore a state of the computer in the characterization tool when the slave application in the object storage of the characterization tool is altered in the execution of the first task.

11. The system of claim 10, wherein the at least one processor comprises a master processor in a master server and the at least one computer comprises a slave processor in a slave server, the master server and the slave server coupled through a network connection, wherein the master processor is configured to provide the slave processor with an initialization routine to execute at least one portion of the computer code, and to control an execution of the at least one portion of the computer code by the slave processor.

12. The system of claim 10, wherein the at least one processor comprises a first processor configured to execute the first task in the computational thread and a second processor configured to execute a second task in a second computational thread, wherein the second task is independent from the first task.

13. The system of claim 10, wherein the at least one processor comprises a first processor configured to execute the first task to generate an output data set, and a second processor configured to execute a second task in a second computational thread, wherein the second task includes an input dataset that is the output data set.

14. The system of claim 10, wherein the at least one processor comprises a master processor and a slave processor coupled through a network connection, wherein the master processor is configured to provide the partition netlists from an integrated circuit netlist to the slave processor, and the slave processor executes at least partially the first task.

15. The system of claim 10, wherein to prepare the input data set for the first task in the computational thread, the at least one processor executes computer code to identify a reusable data set in the object storage, wherein the reusable data set is the input data set for a second task from a second computational thread independent from the first task.

16. The system of claim 10, wherein to prepare an input data set for a first task in the computational thread the at least one processor executes computer code to make a plurality of copies of the input data set and to provide one of the plurality of copies of the input data set to each of a plurality of computers executing parallel computational threads in the networked computer environment.

17. The system of claim 10, wherein to schedule an execution of a computational thread associated with the first partition netlist the processor executes computer code to schedule the execution of the first task in the computational thread before the execution of a second task in the computational thread when an output data set from the first task is used as an input data set for the second task.

18. The system of claim 10, wherein to schedule an execution of a computational thread the processor executes computer code to schedule a parallel execution of a first and a second computational threads that are independent from each other.

19. A non-transitory, machine-readable medium comprising instructions stored in a memory which, when executed by a processor, cause a computer to perform steps in a method, the method comprising:
receiving, from a circuit design tool, partition netlists of an integrated circuit in a partition scheduler of a characterization tool;
scheduling, by at least one computer within a networked computer environment for the characterization tool, an execution of a computational thread associated with a first partition netlist of the partition netlists by the at least one computer;
preparing an input data set for a first task in the computational thread in a slave application, and storing the input data set in an object storage, wherein the input data set comprises a plurality of input stimuli vectors for use as inputs to the first partition netlist;
providing the input data set to the at least one computer;
executing, by the at least one computer in the circuit design tool, the first task in the computational thread associated with the partition netlist; and
restoring a state of the computer in the characterization tool when the slave application in an object storage of the characterization tool is altered in the execution of the first task.

20. The non-transitory, machine readable medium of claim 19, wherein, in the method, scheduling an execution of a computational thread associated with a first partition netlist in the at least one computer comprises re-assigning at least one task on the computational thread to the at least one computer when a second computer in the networked computer environment is non-responsive.

* * * * *